United States Patent
Fudeta

(10) Patent No.: US 7,847,312 B2
(45) Date of Patent: Dec. 7, 2010

(54) NITRIDE SEMICONDUCTOR LIGHT-EMITTING DEVICE

(75) Inventor: Mayuko Fudeta, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/232,248

(22) Filed: Sep. 12, 2008

(65) Prior Publication Data

US 2009/0072249 A1    Mar. 19, 2009

(30) Foreign Application Priority Data

Sep. 14, 2007  (JP) .............................. 2007-239141
Jul. 8, 2008   (JP) .............................. 2008-177954

(51) Int. Cl.
*H01L 33/00*    (2010.01)

(52) U.S. Cl. ................. 257/99; 257/E33.064

(58) Field of Classification Search .................. 257/99, 257/E33.064
See application file for complete search history.

(56) References Cited

U.S. PATENT DOCUMENTS

| 2006/0002442 A1 | 1/2006 | Haberern et al. |
| 2007/0145392 A1 | 6/2007 | Haberern et al. |
| 2008/0135868 A1 * | 6/2008 | Okagawa et al. ............. 257/99 |
| 2009/0026475 A1 | 1/2009 | Yamaguchi et al. |

FOREIGN PATENT DOCUMENTS

| CN | 1977398 | 6/2007 |
| JP | 2006-135311 | 5/2006 |
| WO | WO 2006/095566 | 9/2006 |
| WO | WO 2007/074897 | 7/2007 |

* cited by examiner

*Primary Examiner*—Mark Prenty
(74) *Attorney, Agent, or Firm*—Harness, Dickey & Pierce, PLC

(57) ABSTRACT

A nitride semiconductor light-emitting device including a first n-type nitride semiconductor layer, a light-emitting layer, a p-type nitride semiconductor layer, and a second n-type nitride semiconductor layer in this order, and further including an electrode formed of a transparent conductive film on the second n-type nitride semiconductor layer is provided. The nitride semiconductor light-emitting device has improved light extraction efficiency. The electrode formed of a transparent conductive film is preferably formed on a part of a surface of the second n-type nitride semiconductor layer.

7 Claims, 3 Drawing Sheets

NITRIDE SEMICONDUCTOR LIGHT-EMITTING DEVICE

This nonprovisional application is based on Japanese Patent Application No. 2007-239141 filed on Sep. 14, 2007 and No. 2008-177954 filed on Jul. 8, 2008, with the Japan Patent Office, the entire contents of which are hereby incorporated by reference.

BACKGROUND OF THE INVENTION

1. Field of the Invention

The present invention relates to a nitride semiconductor light-emitting device, and more specifically, to a nitride semiconductor light-emitting device with improved light extraction efficiency.

2. Description of the Related Art

Nitride semiconductor light-emitting devices attract the interests, for example, as an illumination light source, and an excitation light source for white light-emitting diode. A nitride semiconductor light-emitting device generally has a structure of sandwiching a light-emitting layer between an n-type nitride semiconductor layer and a p-type nitride semiconductor layer, and luminescence occurs as a result of recoupling between an electron and a hole.

FIG. 9 is a schematic section view of a conventional nitride semiconductor light-emitting device described in Japanese Patent Laying-Open No. 2006-135311. In the nitride semiconductor light-emitting device shown in FIG. 9, a laminate consisting of nitride semiconductor layers is formed on a substrate 901. The laminate includes, from the side of the substrate 901, a first n-type nitride semiconductor layer 902, an active layer 903, a p-type nitride semiconductor layer 904, and a second n-type nitride semiconductor layer 905 in this order. The second n-type nitride semiconductor layer 905 is formed with a p-side electrode 906 for injecting holes into the p-type nitride semiconductor layer 904, and the first n-type nitride semiconductor layer 902 is formed with an n-side electrode 907.

Here, as the p-side electrode 906, for example, metal such as Al is used, however, when metal is used as the p-side electrode material, the resultant opaque electrode will absorb light to lead the problem of deterioration in light extraction efficiency.

SUMMARY OF THE INVENTION

To solve the above problems, it is an object of the present invention to provide a nitride semiconductor light-emitting device with improved light extraction efficiency.

The present invention provides a nitride semiconductor light-emitting device including a first n-type nitride semiconductor layer, a light-emitting layer, a p-type nitride semiconductor layer, and a second n-type nitride semiconductor layer in this order, and further including an electrode formed of a transparent conductive film on the second n-type nitride semiconductor layer.

Preferably, the electrode formed of a transparent conductive film is formed on a part of a surface of the second n-type nitride semiconductor layer.

Preferably, the electrode formed of a transparent conductive film has a single or plural line form, or a network form. Preferably, the electrode formed of a transparent conductive film is formed by sputtering.

Preferably, in the nitride semiconductor light-emitting device of the present invention, at least a part of a surface on the side where the electrode formed of a transparent conductive film is formed in the second n-type nitride semiconductor layer has protrusions.

Preferably, the nitride semiconductor light-emitting device has a current blocking portion. Preferably, the current blocking portion is composed of a concave portion formed on a surface of the second n-type nitride semiconductor layer and having a depth that reaches at least a surface on the side of the second n-type nitride semiconductor layer of the p-type nitride semiconductor layer. Alternatively, it is preferred that the current blocking portion is composed of a concave portion formed on a surface of the second n-type nitride semiconductor layer and having a depth that reaches at least a surface on the side of the light-emitting layer of the first n-type nitride semiconductor layer, and an insulation layer formed so as to cover a bottom face and a lateral face of the concave portion.

Preferably, the nitride semiconductor light-emitting device of the present invention further includes a pad electrode for wire bonding, connected to the electrode formed of a transparent conductive film. Preferably, the pad electrode is formed on the current blocking portion.

According to the present invention, a nitride semiconductor light-emitting device having improved light extraction efficiency compared with the conventional case is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
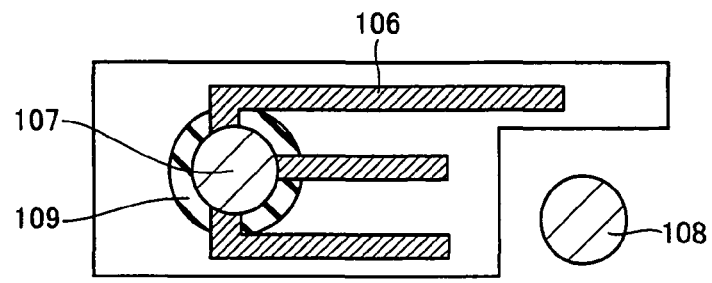
FIGS. 1A and 1B are schematic views showing one preferred example of a nitride semiconductor light-emitting device of the present invention.
Figure 1B:
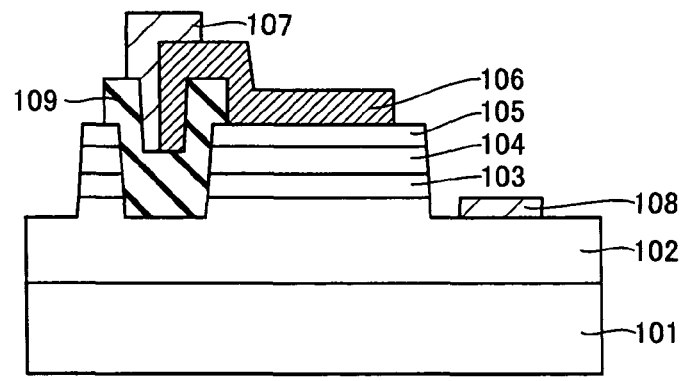

FIGS. 1A and 1B are schematic views showing one preferred example of a nitride semiconductor light-emitting device of the preset invention, in which FIG. 1A is a top view, and FIG. 1B is a section view. The nitride semiconductor light-emitting device shown in FIGS. 1A and 1B has a first n-type nitride semiconductor layer 102, a light-emitting layer 103, a p-type nitride semiconductor layer 104, and a second n-type nitride semiconductor layer 105 in this order on a substrate 101. Further, it has an electrode 106 formed of a transparent conductive film on a part of second n-type nitride semiconductor layer 105. Further, second n-type nitride semiconductor layer 105 is formed with a concave portion having a depth that reaches first n-type nitride semiconductor layer 102, and an insulation layer 109 is formed so as to cover a bottom face and a lateral face of the concave portion. The nitride semiconductor light-emitting device has a pad electrode 107 connected with electrode 106 formed of a transparent conductive film, on the concave portion, and has a pad electrode 108 on first n-type nitride semiconductor layer 102.

In the present invention, the electrode formed on second n-type nitride semiconductor layer 105 is an electrode formed of a transparent conductive film rather than a metal thick-film electrode. Light will be absorbed when opaque metal is used as the electrode, however, by employing the transparent conductive film, it is possible to suppress absorption of light by the electrode, and hence to improve the light extraction efficiency.

Here, a thickness of the electrode formed of a transparent conductive film is preferably 10 to 1000 nm, and more preferably 50 to 500 nm. Current diffusion tends to be insufficient with a thickness of less than 10 nm, and transmittance of the transparent conductive film tends to be deteriorated with a thickness exceeding 1000 nm. As a material of the electrode, for example, ITO (indium tin oxide), tin oxide, indium oxide, zinc oxide, gallium oxide, IZO (indium oxide-zinc oxide), AZO (zinc oxide-aluminum oxide), and GZO (zinc oxide-gallium oxide) can be recited.

In the present invention, preferably, electrode 106 formed of a transparent conductive film is formed on a part of a surface of second n-type nitride semiconductor layer 105. This is because it is preferred to make an electrode forming area smaller because even when a transparent conductive film is used, the transparent conductive film is not completely transparent, and absorbs, for example, light of about 5 to 10%. As a result, it is possible to suppress light absorption by the electrode. Preferably, as shown in FIG. 1A, electrode 106 formed of a transparent conductive film has a form made up of a plurality of lines. Also such a structure contributes to reduce the electrode forming area. The form of electrode 106 formed of a transparent conductive film is not limited to the form as shown in FIG. 1A, and may be, for example, a form made up of a single line, or a network form. When the form of the electrode is a form made up of a plurality of lines or a network form, an interval between the lines and a gap distance in the network are not particularly limited, however, they are preferably selected to be a distance that allows current to sufficiently diffuse in second n-type nitride semiconductor layer 105. As will be described later, although second n-type nitride semiconductor layer 105 has a function as a current diffusion layer, however, the current diffusion distance is limited because it does not has such high current diffusing ability as metal has. Therefore, when the distance between lines and the gap distance of network are large, current diffusion may not be sufficiently achieved. For example, in the case of the line form shown in FIG. 1A, the distance between lines may be about 5 to 100 μm. By forming an electrode of line form or network form, it is possible to extract light directly from gaps where the electrode is absent without intervention of the electrode.

Preferably, the electrode 106 formed of a transparent conductive film is formed by sputtering. Formation by sputtering can improve the transparency of the electrode. Further, since contact resistance between the second n-type nitride semiconductor layer and the transparent conductive film can be reduced, voltage can be reduced.

The nitride semiconductor light-emitting device of the present invention has second n-type nitride semiconductor layer 105 on p-type nitride semiconductor layer 104. Second n-type nitride semiconductor layer 105 functions as a current diffusion layer. When an electrode is provided directly on the p-type nitride semiconductor layer, current diffusion does not occur in the p-type nitride semiconductor layer, so that it is necessary to form the electrode on the whole surface of the region where luminescence is requested. In this case, even when a transparent electrode is used as the electrode, extraction efficiency of light tends to decrease because the electrode is formed on the whole surface. By providing the n-type nitride semiconductor layer, current diffusion occurs in the n-type nitride semiconductor layer, so that it is no longer necessary to provide the electrode on the whole surface. As a result, it becomes possible to directly extract light from the region where no electrode is formed.

As second n-type nitride semiconductor layer 105, for example, an n-type GaN layer, an n-type InGaN layer, an n-type AlGaN layer, or a laminate structure in which a plurality of these layers are combined may be used without particular limitation. Further, a thickness of second n-type nitride semiconductor layer 105 may be, for example, 10 to 3000 nm, and preferably 10 to 1000 nm.

Preferably, at least a part of a surface on the side where electrode 106 formed of a transparent conductive film is formed, in second n-type nitride semiconductor layer 105 has protrusions. Since the nitride semiconductor layer has a high refractive index, the light generating in the light-emitting layer may return inside the device because it is reflected at the interface between air or the resin used in a package due to refraction of light. When light returns inside the device, the light is absorbed again in the light-emitting layer, so that light loss occurs. By forming protrusions on a surface of second n-type nitride semiconductor layer 105, it is possible to prevent light from returning inside the device due to refraction, and hence to improve the light extraction efficiency.

In the present invention, like the nitride semiconductor light-emitting device as shown in FIGS. 1A and 1B, it is preferred to have a current blocking portion. By providing the current blocking portion, the luminescent efficiency can be improved. The current blocking portion may be formed, for example, by removing a part of second n-type nitride semiconductor layer 105, and forming a concave portion on a surface of second n-type nitride semiconductor layer 105, having a depth that reaches at least a surface on the side of second n-type nitride semiconductor layer 105 of p-type nitride semiconductor layer 104. As described above, since second n-type nitride semiconductor layer 105 functions as a current diffusion layer, the current fails to diffuse in the region where second n-type nitride semiconductor layer 105 is removed, and luminescence do not occur. Also by removing a part of second n-type nitride semiconductor layer 105 and p-type nitride semiconductor layer 104 to form a concave portion where the p-type layer is exposed, and forming a n-type electrode such as transparent conductive film in the concave portion, the function of the current blocking portion can be achieved because contact resistance between p-type nitride semiconductor layer 104 and the transparent conductive film is very high. In this case, when the transparent conductive film is formed by sputtering, the part where the transparent conductive film is in contact with the second n-type nitride semiconductor layer has low contact resistance, while the part where it is in contact with the p-type nitride semiconductor layer has high resistance due to plasma of sputtering. Therefore, it functions as a more desirable current blocking portion.

Alternatively, the current blocking portion may be formed by providing a surface of second n-type nitride semiconductor layer 105 with a concave portion having a depth that reaches at least a surface on the side of light-emitting layer 103 of first n-type nitride semiconductor layer 102, and forming insulation layer 109 so as to cover a bottom face and a lateral face of the concave portion, as shown in FIGS. 1A and 1B. According to the current blocking portion of such configuration, since even the light-emitting layer capable of absorbing light is removed, it is possible to further improve the light extraction efficiency. As insulation layer 109, for example, silicon oxide, aluminum oxide, titanium oxide, silicon nitride, and aluminum nitride can be recited. A thickness of insulation layer 109 may be for example, 10 to 1000 nm.

In the nitride semiconductor light-emitting device of the present invention, as shown in FIGS. 1A and 1B, pad electrodes 107 and 108 for wire bonding are preferably formed to keep wire bonding performance. Pad electrode 107 is connected with electrode 106 formed of a transparent conductive film, and pad electrode 107 and electrode 106 formed of a transparent conductive film are preferably in contact with each other. As a result, current is efficiently introduced from pad electrode 107 to electrode 106 formed of a transparent conductive film. As the pad electrode, a conventionally known material may be used, and for example, a laminate or an alloy of Ti and Al, a laminate or an alloy of Hf and Al and the like may be used.

Preferably, pad electrode 107 is formed on the current blocking portion. Since the pad electrode is generally opaque, when luminescence occurs directly below it, the light is absorbed by the pad electrode, and light loss arises, which may result in reduction in light extraction efficiency. By providing the pad electrode on the current blocking portion, it is possible to improve the light extraction efficiency while avoiding light absorbance by the pad electrode.

As substrate 101, first n-type nitride semiconductor layer 102, light-emitting layer 103, and p-type nitride semiconductor layer 104, conventionally known appropriate materials may be used.

As described above, the nitride semiconductor light-emitting device of the present invention is featured in that the uppermost layer in a laminate consisting of nitride semiconductor layers is a second n-type nitride semiconductor layer, and an electrode formed of a transparent conductive film is formed on the second n-type nitride semiconductor layer. By making the uppermost layer of the laminate be the second n-type nitride semiconductor layer, current will diffuse in the second n-type nitride semiconductor layer even when an electrode is formed in a part of a surface of the second n-type nitride semiconductor layer. Therefore, luminescence on the whole surface is enabled, and hence luminescent efficiency can be improved.

Also, according to the present invention, since the electrode formed of a transparent conductive film can be formed only a part of a surface of the second n-type nitride semiconductor layer, it is possible to reduce light absorption by the electrode, and to thereby suppress reduction in luminescent efficiency. In contrast to this, in a conventional light-emitting device in which the uppermost layer of the laminate consisting of the nitride semiconductor layer is a p-type nitride semiconductor layer, the electrode should be formed on the whole surface of the p-type nitride semiconductor layer because current fails to diffuse in the p-type nitride semiconductor layer. This resulted in significant decrease in luminescent efficiency due to light absorption by the electrode.

The structure in which a pad electrode is formed on a part of a surface of a p-type nitride semiconductor layer is conventionally known, however, in the case of this structure, current fails to diffuse in the p-type nitride semiconductor layer, and light is absorbed by the opaque pad electrode, resulting that light extraction efficiency is reduced. In contrast to this, according to the nitride semiconductor light-emitting device of the present invention, since the electrode formed of a transparent conductive film can be formed into a line form or a network form, light from the light-emitting layer can be directly extracted in the region where the transparent conductive film is not formed, and light absorption by the electrode is suppressed. Therefore, light extraction efficiency is excellent.

Further, as described above, in the nitride semiconductor light-emitting device of the present invention, preferably, protrusions are imparted to a surface on the electrode forming side in the second n-type nitride semiconductor layer. By imparting such protrusions to surface of the second n-type nitride semiconductor layer, multiple reflection of light inside the semiconductor layer can be suppressed or prevented, so that it is possible to further improve the light extraction efficiency. In the present invention, a thickness of the second n-type nitride semiconductor layer may be, for example, 10 to 3000 nm, and preferably from 10 to 1000 nm. When protrusions are imparted to a surface of the second n-type nitride semiconductor layer, a thickness of the second n-type nitride semiconductor layer is desirably equal to or more than 300 nm. Even when the second n-type nitride semiconductor layer is formed to have a film thickness of equal to or more than 300 nm, voltage rise is difficult to occur because resistance of the second n-type nitride semiconductor layer is low. On the other hand, in a conventional light-emitting device in which an uppermost layer of a laminate consisting of nitride semiconductor layers is a p-type nitride semiconductor layer, the p-type nitride semiconductor layer generally has a thickness of about 200 nm or less because it is highly resistant, and a large film thickness will result in voltage rise. When the thickness of the p-type nitride semiconductor layer is made as thin as about 200 nm or less, it is difficult to impart protrusions to a surface of the p-type nitride semiconductor layer.

Here, Japanese Patent Laying-Open No. 2006-13500 discloses a light-emitting device in which protrusions are imparted to a surface of a p-type nitride semiconductor layer. With such a structure, however, a region where the bottom face of the concave portion reaches the light-emitting layer arises, and leak defect may occur. Further, in such a light-emitting device, since the uppermost layer of the laminate consisting of nitride semiconductor layers is a p-type nitride semiconductor layer, an electrode should be formed on the whole surface of the p-type nitride semiconductor layer, as described above. However, when an electrode is formed on the p-type nitride semiconductor layer having protrusions, the area of the formed electrode is larger than that in the case where the p-type nitride semiconductor layer has a flat surface, and the light amount absorbed by the electrode is further increased.

As a structure of a device for improving the light extraction efficiency, a structure in which protrusions are provided on a surface of a sapphire substrate, and a nitride semiconductor layer is formed thereon is conventionally known. This structure causes irregular reflection of light at the interface between the sapphire substrate and the nitride semiconductor layer to allow extraction of more light on the side of the sapphire substrate, thereby extracting light from the lateral face of the sapphire substrate. In the light-emitting device having such a structure, when the paste material used in die-bonding the sapphire substrate is a light-absorbing material, the light outgoing on the side of the sapphire substrate is absorbed by the paste material on the back side of the substrate, leading the problem of reduction in luminescent efficiency. On the other hand, in the nitride semiconductor light-emitting device of the present invention, since the light extraction efficiency on the superficial side of the device (the side opposite to the substrate) is very high, it is not necessary to provide protrusions on a surface of the substrate to extract light from a lateral face of the substrate. According to the nitride semiconductor light-emitting device of the present invention in which the superficial side of the device is a light extracting face, and protrusions are imparted to a surface of the second n-type nitride semiconductor layer, since the light having bounced back by being reflected at the interface between the substrate and the nitride semiconductor layer is desirably extracted outside via the face having protrusions formed on a surface of the second n-type nitride semiconductor layer, very high light extraction efficiency can be obtained. Further, in the nitride semiconductor light-emitting device of the present invention in which the superficial side of the device is a light extracting face, the paste material for die-bonding the substrate is not particularly limited, and therefore may be appropriately selected from materials having excellent heat conductivity.

As described above, in the present invention, the electrode formed of a transparent conductive film is preferably formed by sputtering. By forming a transparent conductive film on the second n-type nitride semiconductor layer by sputtering, it is possible to form an electrode having lower resistance. This attributes, for example, to the following facts: i) the n-type nitride semiconductor layer is not adversely affected by plasma; ii) according to the electrode forming method by sputtering, the adhesion is higher, and the contact resistance is reduced because atoms of the electrode material arriving the semiconductor layer have high energy; and iii) sheet resistance of the transparent conductive film can be reduced because a film of higher precision and crystallinity can be formed by sputtering than by vapor deposition.

In contrast to this, in a conventional light-emitting device in which the uppermost layer of a laminate consisting of nitride semiconductor layers is a p-type nitride semiconductor layer, when a transparent conductive film is formed on the p-type nitride semiconductor layer, it would have high resistance depending on its forming method. For example, when the transparent conductive film is tried to form by sputtering, resistance of the surface increases under the influence that a surface of the p-type nitride semiconductor layer is exposed to plasma in a sputtering device, and the problem of increase in voltage arises.

In the following, the present invention will be explained in more detail by way of examples, however, the present invention will not be limited to these examples.

EXAMPLES

Example 1

A nitride semiconductor light-emitting device shown in FIGS. 1A and 1B was fabricated in the following manner. First, on a substrate 101 which is a sapphire substrate, a buffer layer made of $Al_rGa_{1-r}N$ ($0 \leq r \leq 1$) (50 nm thick), a first n-type nitride semiconductor layer 102 (5 μm thick) which is a n-type GaN layer, a light-emitting layer 103 (100 nm thick) consisting of a barrier layer made of GaN and a well layer made of $In_qGa_{1-q}N$ ($0<q<1$), a p-type nitride semiconductor layer 104 consisting of a p-type AlGaN layer (30 nm thick) and a p-type GaN layer (200 nm thick), and a second n-type nitride semiconductor layer 105 which is a n-type GaN layer (0.2 μm thick) were caused to grow in this order.

Figure 2:
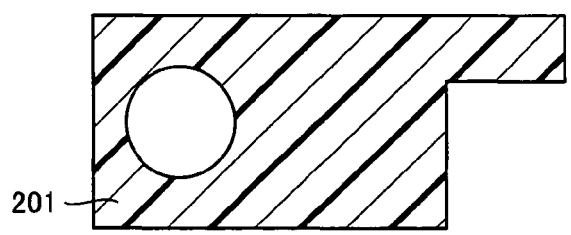
FIG. 2 is a top view showing a resist mask for forming a concave portion.
Figure 3:
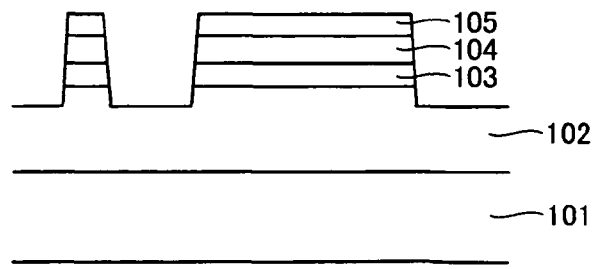
FIG. 3 is a schematic section view of a nitride semiconductor light-emitting device in production after formation of a concave portion.
Figure 4:
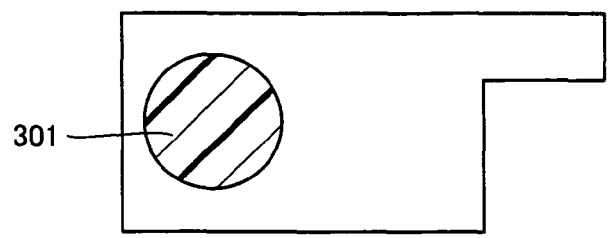
FIG. 4 is a top view showing a resist mask for $SiO_2$ etching.
Figure 5:
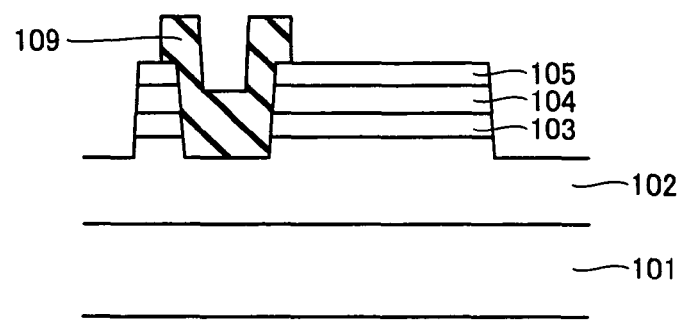
FIG. 5 is a schematic section view of a nitride semiconductor light-emitting device in production after formation of an insulation layer.

Next, after forming a resist mask 201 having a form as shown in FIG. 2, a concave portion having such a depth that the first n-type nitride semiconductor layer 102 is exposed was formed by dry etching using the resist mask (mesa etching). FIG. 3 shows a schematic section view of the nitride semiconductor light-emitting device in production after formation of the concave portion. Then after forming a $SiO_2$ layer of 1 μm thick on the whole surface, a resist mask 301 as shown in FIG. 4 was formed, and the $SiO_2$ layer in the part where resist mask 301 was not formed was removed by etching. As a result, an insulation layer 109 was formed. FIG. 5 shows a schematic section view of the nitride semiconductor light-emitting device in production after formation of the insulation layer. Thereafter, resist mask 301 was removed.

Figure 6:
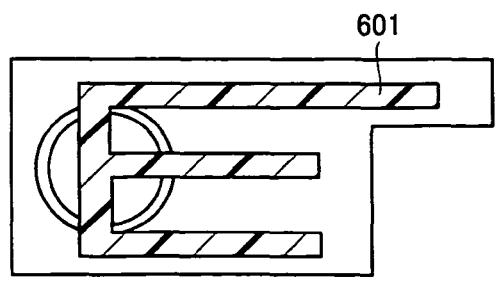
FIG. 6 is a top view showing a resist mask for forming an electrode formed of a transparent conductive film.
Figure 7:
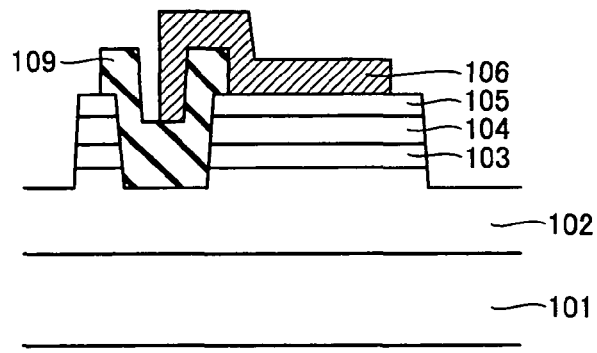
FIG. 7 is a schematic section view of a nitride semiconductor light-emitting device in production after formation of an electrode formed of a transparent conductive film.

Next, after forming an ITO layer of 200 nm thick on the whole surface by sputtering, a resist mask 601 as shown in FIG. 6 was formed, the ITO in the part where resist mask 601 was not formed was removed by etching. As a result, an electrode 106 formed of a transparent conductive film was formed. FIG. 7 shows a schematic section view of the nitride semiconductor light-emitting device in production after formation of the electrode formed of a transparent conductive film. Resist mask 601 was then removed. Finally, pad electrodes 107 and 108 were formed by vapor depositing Ti/Al/Ti/Al and conducting liftoff, after forming a resist mask for formation of pad electrode, to obtain the nitride semiconductor light-emitting device shown in FIGS. 1A and 1B.

Luminescent efficiency of the obtained light-emitting device was measured, to reveal that the light extraction efficiency was improved by about 20% compared to the light-emitting device in which 0.5 μm thick Al in place of the ITO film was used as an electrode, and having no current blocking portion.

Example 2

A nitride semiconductor light-emitting device shown in FIG. 8 was fabricated in the following manner. First, likewise the Example 1, on a substrate 801 which is a sapphire substrate, a buffer layer made of $Al_rGa_{1-r}N$ ($0 \leq r \leq 1$) (50 nm thick), a first n-type nitride semiconductor layer 802 (5 μm thick) which is a n-type GaN layer, a light-emitting layer 803 (100 nm thick) consisting of a barrier layer made of GaN and a well layer made of $In_qGa_{1-q}N$ ($0<q<1$), a p-type nitride semiconductor layer 804 consisting of a p-type AlGaN layer (30 nm thick) and a p-type GaN layer (200 nm thick), and a second n-type nitride semiconductor layer 805 which is a n-type GaN layer (0.2 μm thick) were caused to grow in this order.

Figure 8:
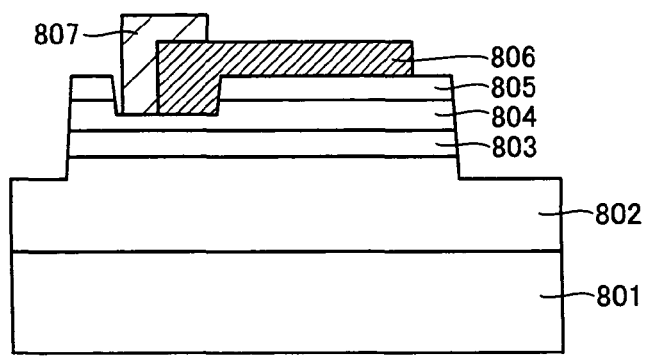
FIG. 8 is a schematic section view of one another preferred example of a nitride semiconductor light-emitting device of the present invention.
Figure 9:
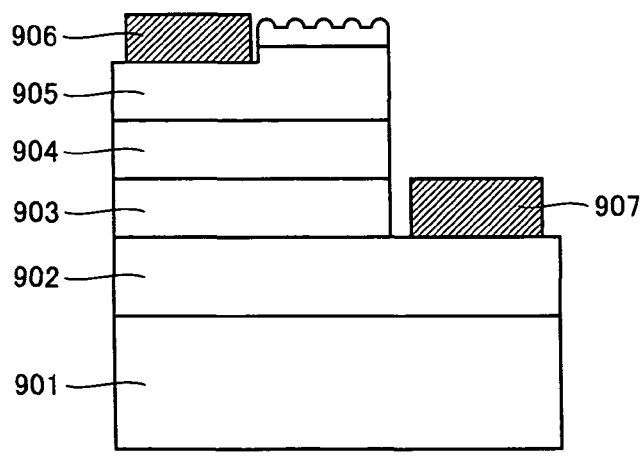
FIG. 9 is a schematic section view of a conventional nitride semiconductor light-emitting device.

Next, after forming a resist mask 201 of the form as shown in FIG. 2, etching was conducted to the middle of p-type nitride semiconductor layer 804 by dry etching using the resist mask, to form a concave portion having such a depth that p-type nitride semiconductor layer 804 is exposed (see FIG. 8). Resistance of the exposed surface of p-type nitride semiconductor layer 804 is increased due to the influence of plasma during the dry etching. Therefore, even when an electrode formed of the transparent conductive film and a pad electrode are formed thereon, current will not injected from exposed p-type nitride semiconductor layer 804, so that it is not necessary to form a $SiO_2$ layer in the concave portion as is in Example 1. Therefore, after formation of the concave portion, similar steps in Example 1 were conducted except that the step of forming a $SiO_2$ layer was omitted, to fabricate the nitride semiconductor light-emitting device as shown in FIG. 8. In FIG. 8, 806 is an electrode formed of ITO and 807 is a pad electrode.

Luminescent efficiency of the obtained light-emitting device was measured, to reveal that the light extraction efficiency was improved by about 20% compared to the light-emitting device in which 0.5 µm thick Al was used as an electrode in place of the ITO film, and having no current blocking portion. Further, in the nitride semiconductor light-emitting device of Example 2, since the current blocking portion is composed of a concave portion having a depth that reaches p-type nitride semiconductor layer 804 formed on a surface of second n-type nitride semiconductor layer 805, and since no insulation layer is provided, the productivity is improved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising:
   a first n-type nitride semiconductor layer;
   a light-emitting layer;
   a p-type nitride semiconductor layer;
   a second n-type nitride semiconductor layer in this order;
   an electrode formed of a transparent conductive film on said second n-type nitride semiconductor layer; and
   a current blocking portion.

2. The nitride semiconductor light-emitting device according to claim 1, wherein said current blocking portion is composed of a concave portion formed on a surface of said second n-type nitride semiconductor layer and having a depth that reaches at least a surface on the side of said second n-type nitride semiconductor layer of the p-type nitride semiconductor layer.

3. The nitride semiconductor light-emitting device according to claim 1, wherein said current blocking portion is composed of a concave portion formed on a surface of said second n-type nitride semiconductor layer and having a depth that reaches at least a surface on the side of said light-emitting layer of said first n-type nitride semiconductor layer, and an insulation layer formed so as to cover a bottom face and a lateral face of said concave portion.

4. The nitride semiconductor light-emitting device according to claim 1, further comprising a pad electrode for wire bonding, connected with said electrode formed of a transparent conductive film.

5. The nitride semiconductor light-emitting device according to claim 4, wherein said pad electrode is formed on said current blocking portion.

6. The nitride semiconductor light-emitting device according to claim 1, wherein said electrode formed of a transparent conductive film is formed by sputtering.

7. The nitride semiconductor light-emitting device according to claim 1, wherein at least a part of a surface on the side where said electrode formed of a transparent conductive film is formed in said second n-type nitride semiconductor layer has protrusions.

* * * * *